(12) United States Patent  (10) Patent No.: US 7,709,848 B2
Sugiura  (45) Date of Patent: May 4, 2010

(54) GROUP III NITRIDE SEMICONDUCTOR LIGHT EMITTING DEVICE

(75) Inventor: Katsumi Sugiura, Osaka (JP)

(73) Assignee: Panasonic Corporation, Osaka (JP)

( * ) Notice: Subject to any disclaimer, the term of this patent is extended or adjusted under 35 U.S.C. 154(b) by 679 days.

(21) Appl. No.: 11/600,106

(22) Filed: Nov. 16, 2006

(65) Prior Publication Data

US 2007/0110112 A1 May 17, 2007

(30) Foreign Application Priority Data

Nov. 16, 2005 (JP) ............................. 2005-331722

(51) Int. Cl.
*H01L 33/06* (2006.01)
*H01L 33/32* (2006.01)

(52) U.S. Cl. .............................. 257/94; 257/13; 257/79; 257/86; 257/96; 257/97; 257/103; 257/190; 257/E33.011; 257/E33.034

(58) Field of Classification Search ............. 257/12–15, 257/79, 86, 94, 96, 97, 103, 190, 191, 201, 257/E33.011, E33.034
See application file for complete search history.

(56) References Cited

U.S. PATENT DOCUMENTS

2007/0290230 A1* 12/2007 Kawaguchi et al. ......... 257/196

FOREIGN PATENT DOCUMENTS

JP 2003-289176 A 10/2003
WO WO 2005034301 A1 * 4/2005

* cited by examiner

*Primary Examiner*—Jerome Jackson, Jr.
*Assistant Examiner*—Yu Chen
(74) *Attorney, Agent, or Firm*—McDermott Will & Emery LLP (57) ABSTRACT

A group III nitride semiconductor light emitting device according to the present invention includes an intermediate layer formed of $Al_xGa_{1-x-y}In_yN$ ($0<X<1$, $0<y<1$, $x+y<1$) between an active layer and a cladding layer and an electron blocking layer formed of p-type group III nitride semiconductor having a smaller electron affinity than that of the intermediate layer so as to be in contact with the intermediate layer. The semiconductor light emitting layer may be a laser diode or a LED.

5 Claims, 9 Drawing Sheets

GROUP III NITRIDE SEMICONDUCTOR LIGHT EMITTING DEVICE

BACKGROUND OF THE INVENTION

1. Field of the Invention

The present invention relates to a semiconductor light emitting device using group III nitride semiconductor.

2. Description of the Related Art

In recent years, there have been increased demands for semiconductor laser diodes capable of outputting blue violet light as a light source for next generation high-density optical disks. Thus, an increased number of research and development of group III nitride semiconductor, i.e., direct energy-gap semiconductor having a forbidden band of 1.9 eV to 6.2 eV have been carried out.

Among light emitting devices including group III nitride semiconductor, to increase confinement of light and suppress dispersion of magnesium (Mg) from a p-type cladding layer to an active layer, a laser diode is formed to have a structure in which an optical guide layer and an intermediate layer are formed between the active layer and the p-type cladding layer. Furthermore, there are cases where in order to suppress overflow of electrons from the active layer to the p-type cladding layer, an electron blocking layer made of a material having a smaller electron affinity than those of the intermediate layer and the p-type cladding layer is provided immediately under the p-type cladding layer. To realize a highly reliable blue violet laser diode, a low threshold current is necessary. Therefore, it is very important to sufficiently suppress overflow of electrons from the active layer.

Figure 10:
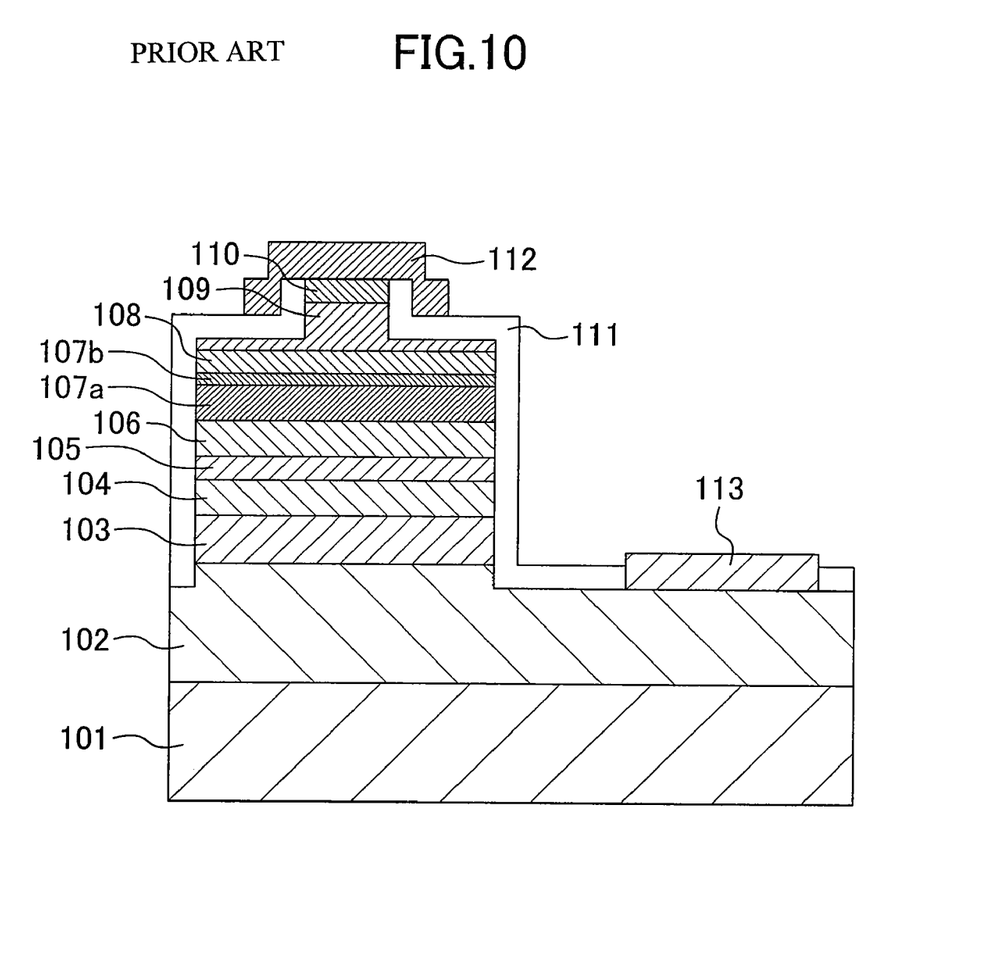
FIG. 10 is a cross-sectional view illustrating a structure of a known group III nitride semiconductor laser diode.

Hereafter, a known group III nitride semiconductor laser diode will be described. FIG. 10 is a cross-sectional view illustrating a structure of the known group III nitride semiconductor laser diode.

As shown in FIG. 10, the known group III nitride semiconductor laser diode includes an n-type contact layer 102 epitaxially grown on a sapphire substrate 101, an n-type cladding layer 103 provided on the n-type contact layer 102, an undoped n-side light guide layer 104 provided on the n-type cladding layer 103, a multi-quantum well (MQW) active layer 105 provided on the undoped n-side light guide layer 104, an undoped p-side light guide layer 106 provided on the MQW active layer 105, an undoped first intermediate layer 107a provided on the undoped p-side light guide layer 106, an undoped second intermediate layer 107b provided on the undoped first intermediate layer 107a, a p-type electron blocking layer 108 provided on the undoped second intermediate layer 107b, a p-type cladding layer 109 provided on the p-type electron blocking layer 108 and having a convex portion and a p-type contact layer 110 provided on the convex portion of the p-type cladding layer 109. The known group III nitride semiconductor laser diode further includes an insulating film 111 provided over the substrate so as to cover part of an upper surface of the n-type contact layer 102 and side surfaces of the n-type cladding layer 103, the undoped n-side light guide layer 104, the MQW active layer 105, the undoped p-side light guide layer 106, the undoped first intermediate layer 107a, the undoped second intermediate layer 107b, the p-type electron blocking layer 108, the p-type cladding layer 109 and the p-type contact layer 110, a p-side electrode 112 provided on the p-type contact layer 110, and an n-side electrode 113 provided on the n-type contact layer 102 (for example, see Japanese Laid-Open Publication No. 2003-289176).

Next, the electron overflow suppression effect by an electron blocking layer will be described.

Figure 11:
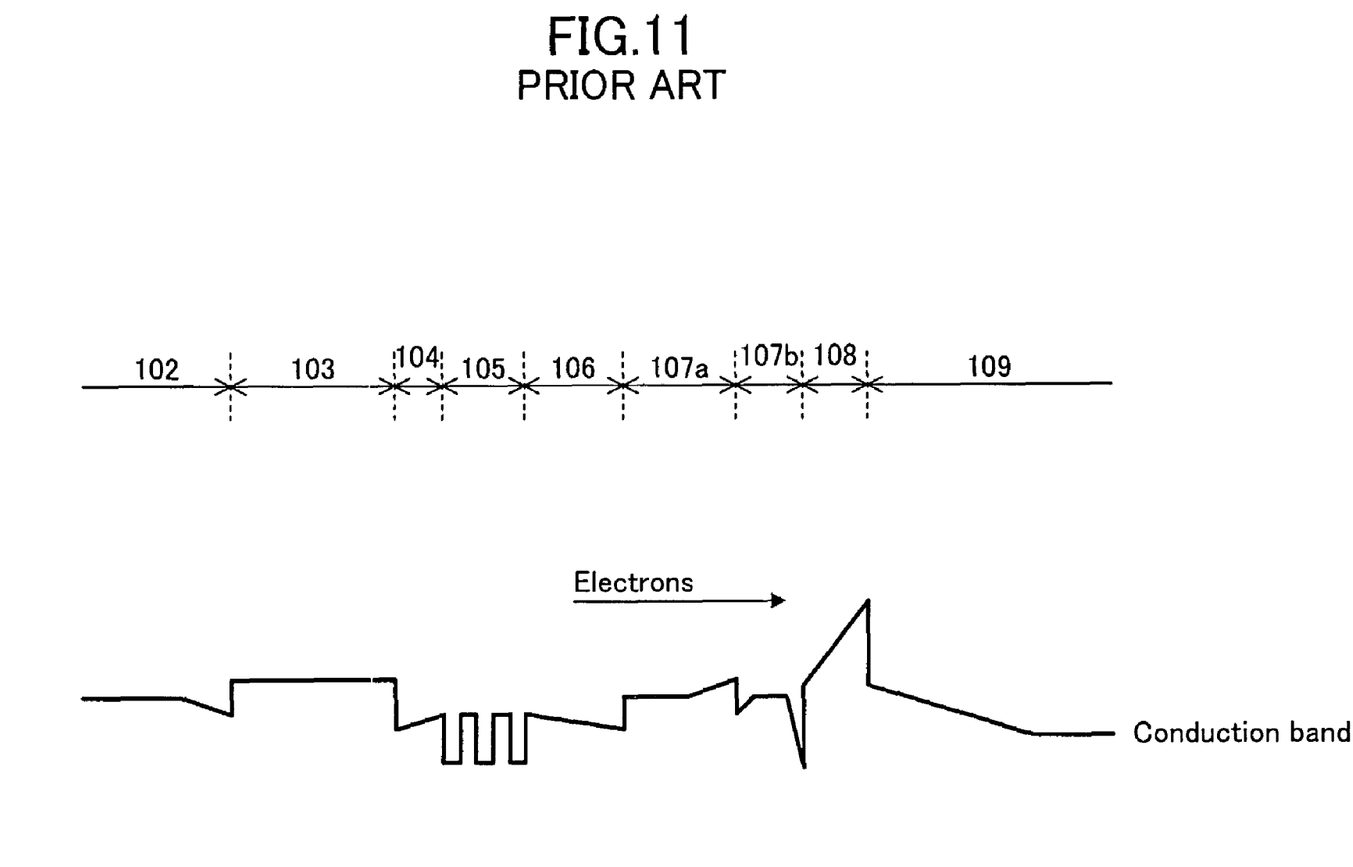
FIG. 11 is a conduction band diagram in main part of the known semiconductor laser diode of FIG. 10.

FIG. 11 is a conduction band diagram in main part of the known semiconductor laser diode of FIG. 10. The p-type electron blocking layer 108 is formed of a material having a smaller electron affinity than those of the intermediate layers 107a and 107b and can suppress overflow of electrons to the p-type cladding layer 109 with a conduction band edge barrier.

SUMMARY OF THE INVENTION

However, in a group III nitride based material, piezo polarization due to lattice distortion gives largely effects. Therefore, a special attention has to be paid to lattice distortion in an intermediate layer.

Figure 12:
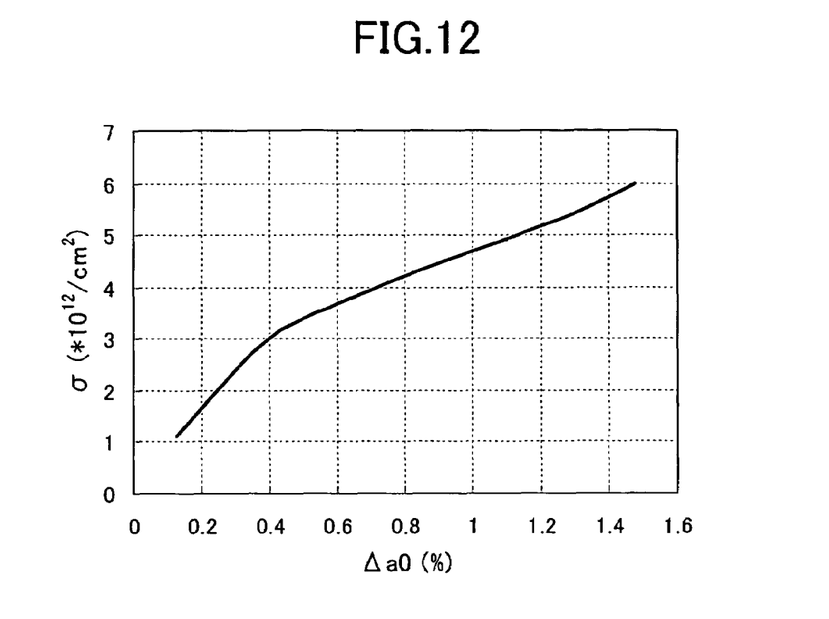
FIG. 12 is a graph showing calculation results for the relationship between a difference Δa0 between a lattice constant of an undoped second intermediate layer in the a-axis direction in a lattice relaxed state and a lattice constant of a p-type electron blocking layer in the a-axis direction in a lattice relaxed state and a fixed charge σ induced by the piezo effect on an interface between the undoped second intermediate layer and the p-type electron blocking layer.

FIG. 12 is a graph showing calculation results for the relationship between a difference $\Delta a0$ between a lattice constant of the undoped second intermediate layer 107b in an a-axis direction in a lattice relaxed state and a lattice constant of the p-type electron blocking layer 108 in the a-axis direction in a lattice relaxed state and a fixed charge $\sigma$ induced by the piezo effect on an interface between the undoped second intermediate layer 107b and p-type electron blocking layer 108. In this case, the fixed charge $\sigma$ and the difference $\Delta a0$ are values obtained in the case where the p-type electron blocking layer 108 is formed of $Al_{0.18}Ga_{0.82}N$ which has the same lattice constant in the a-axis direction as that of GaN and including distortion. These results show as $\Delta a0$ is increased, the fixed charge $\sigma$ is monotonously increased.

Figure 13:
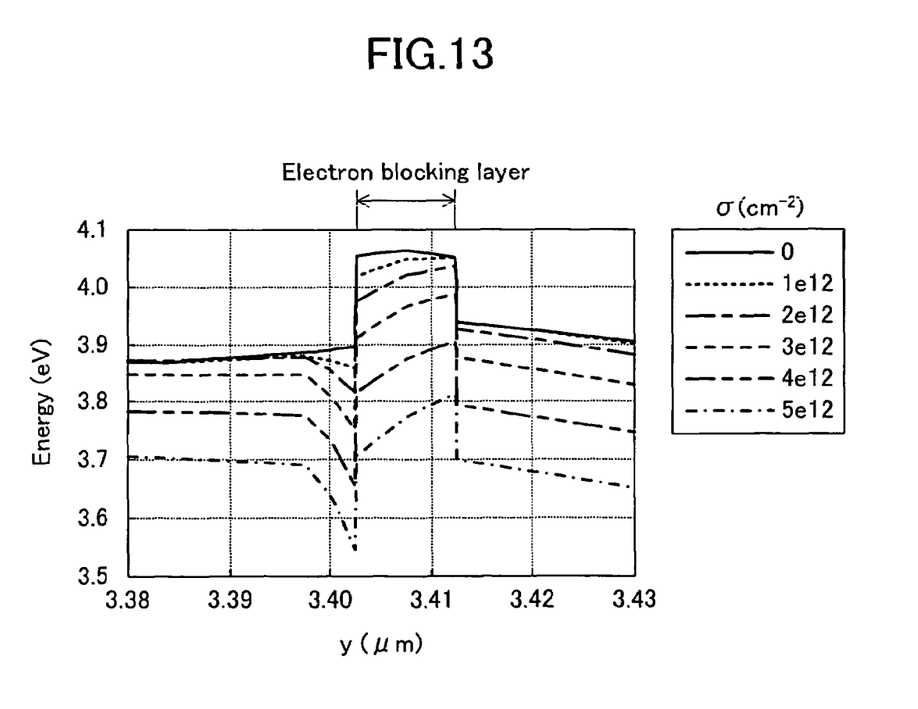
FIG. 13 is a graph showing results from calculation of a conduction band diagram in the periphery of a p-type electron blocking layer using a fixed charge a as a parameter in the known semiconductor laser diode.

FIG. 13 is a graph showing results from calculation of a conduction band diagram in the periphery of the p-type electron blocking layer 108 using the fixed charge $\sigma$ as a parameter. This indicates that with increase in the fixed charge $\sigma$, the conduction band edge barrier becomes lower and overflow of electrons can easily occur.

Note that such inconvenience might occur in a LED (light emitting diode) including a cladding layer.

It is therefore an object of the present invention to provide a highly reliable group III nitride semiconductor light emitting device of which a threshold current is low.

To achieve the above-described object, a group III nitride semiconductor light emitting device according to the present invention includes: a substrate; an n-type nitride semiconductor layer formed of group III nitride semiconductor containing an n-type impurity on the substrate and including an n-type cladding layer; an active layer for generating light, the active layer being formed on the n-type nitride semiconductor layer and having a smaller bandgap energy than that of the n-type cladding layer; an intermediate layer formed of $Al_xGa_{1-x-y}In_yN$ (0<x<1, 0<y<1, x+y<1) over the active layer; an electron blocking layer formed of p-type group III nitride semiconductor having a smaller electron affinity than that of the intermediate layer; and a p-type nitride semiconductor layer formed of group III nitride semiconductor containing a p-type impurity on the electron blocking layer and including a p-type cladding layer having a larger bandgap energy than that of the active layer.

In this structure, the intermediate layer is formed of $Al_xGa_{1-x-y}In_yN$. Thus, by adjusting a mixing ratio between elements, the generation of overflow of electrons can be prevented and also a threshold can be reduced.

The electron blocking layer may be formed of $Al_{xb}Ga_{1-xb}N$ ($0 \leq xb \leq 1$).

Specifically, when a value obtained by dividing a difference between a lattice constant of the intermediate layer in an a-axis direction in a lattice relaxed state and a lattice constant of the electron blocking layer in the a-axis direction in a lattice relaxed state by the lattice constant of the electron blocking layer in a lattice relaxed state is 0.4% or less, a fixed charge generated at an interface between the intermediate layer and the electron blocking layer due to the piezo polarization can be reduced. Therefore, a group III nitride semiconductor light emitting device having a low threshold can be realized.

Moreover, when a bandgap energy Eg of the intermediate layer satisfies Eg≧3.2 eV, consumption carriers in the intermediate layer can be suppressed and the threshold Ith can be suppressed to a low level.

Furthermore, when an electron affinity $\chi$ of the intermediate layer satisfies $\chi$≧3.35 eV, overflow of electrons can be suppressed.

A semiconductor laser diode, a semiconductor LED and the like for emitting blue violet light are examples of the group III nitride semiconductor device.

DESCRIPTION OF THE PREFERRED EMBODIMENTS

Embodiments

A semiconductor light emitting device according to an embodiment of the present invention will be described with reference to FIG. 1.

Figure 1:
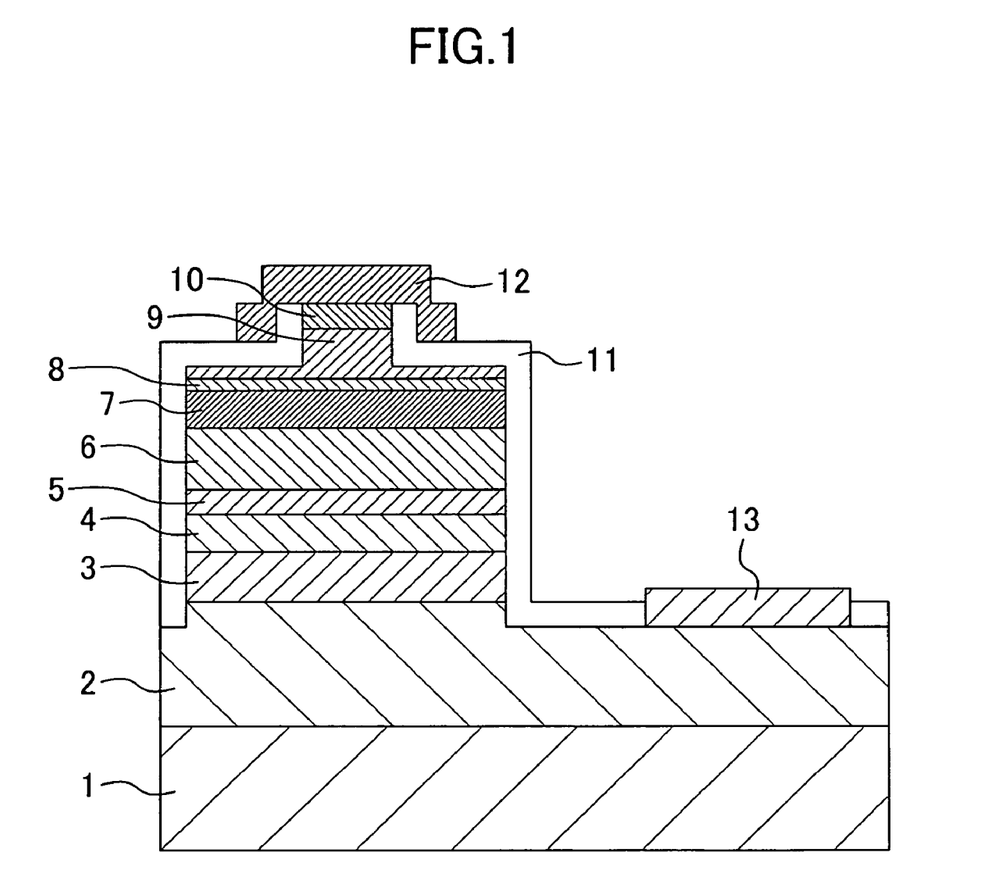
FIG. 1 is a cross-sectional view illustrating a structure of a semiconductor laser diode according to an embodiment of the present invention.
Figure 2:
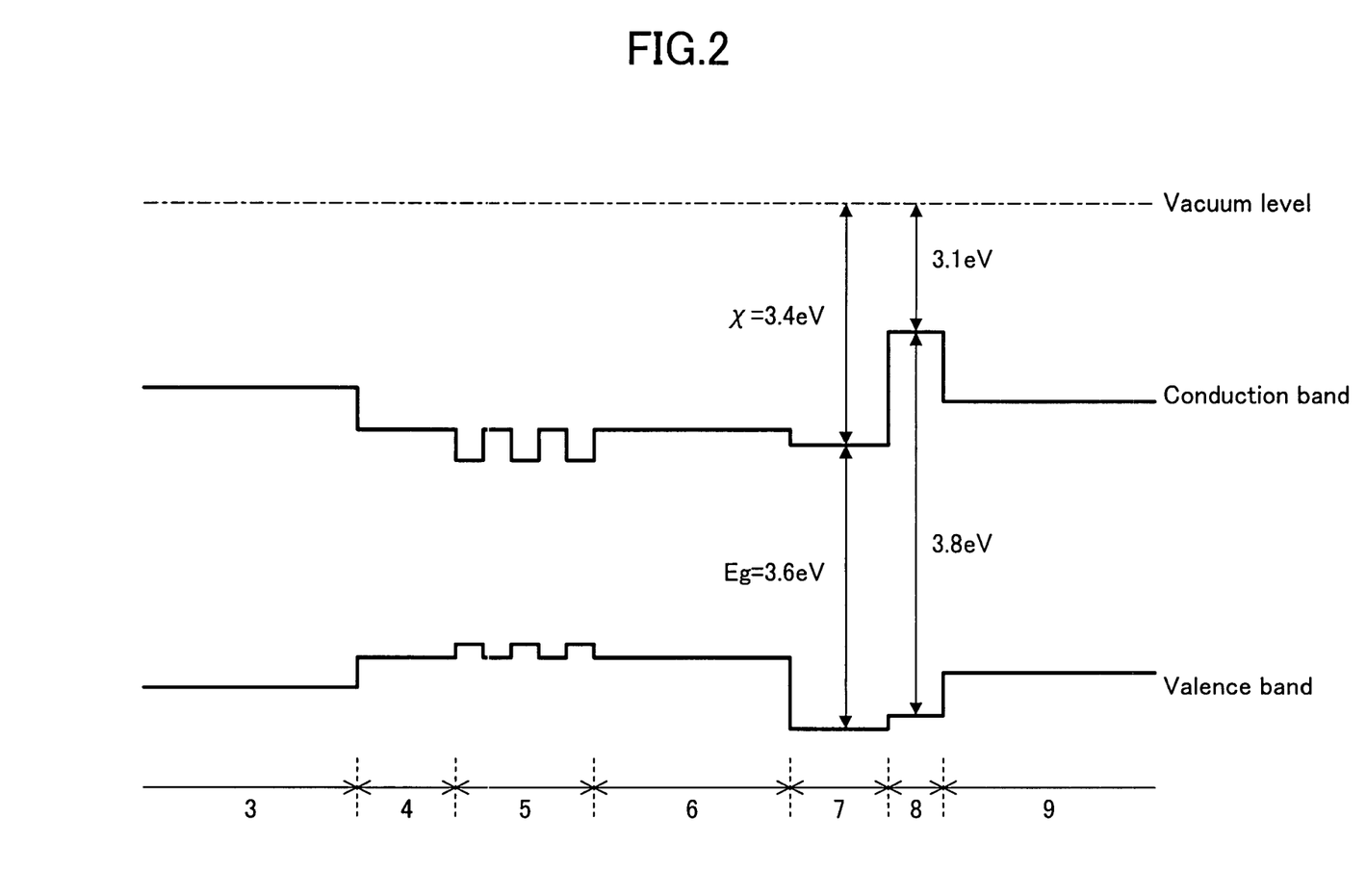
FIG. 2 is a band diagram of the semiconductor laser diode of the embodiment of the present invention.

FIG. 1 is a cross-sectional view illustrating a structure of a semiconductor laser diode according to an embodiment of the present invention. FIG. 2 is a band diagram of the semiconductor laser diode of this embodiment.

As shown in FIG. 1, the semiconductor laser diode of this embodiment includes, a substrate 1, for example, made of sapphire, a low temperature buffer layer (not shown) made of GaN, an n-type contact layer 2 made of n-type group III nitride semiconductor, an n-type cladding layer 3 made of n-type group III nitride semiconductor, an n-side light guide layer 4 made of n-type group III nitride semiconductor, a multi-quantum well (MQW) active layer 5 made of undoped group III nitride semiconductor and having a smaller bandgap energy than that of the n-type cladding layer 3, a p-side light guide layer 6 made of undoped group III nitride semiconductor, an intermediate layer 7 made of $Al_xGa_{1-x-y}In_yN$ (0<x<1, 0<y<1, x+y<1), an electron blocking layer 8 made of p-type group III nitride semiconductor and having a smaller affinity than that of the intermediate layer 7, a p-type cladding layer 9 made of p-type group III nitride semiconductor having a larger bandgap energy than that of the MQW active layer 5 and having a convex portion, and a p-type contact layer 10 made of p-type group III nitride semiconductor. The n-type contact layer 2, the n-type cladding layer 3, the n-side light guide layer 4, the MQW active layer 5, the p-side light guide layer 6, the intermediate layer 7, the electron blocking layer 8, the p-type cladding layer 9 and the p-type contact layer 10 are formed in this order on the substrate 1. Moreover, the semiconductor laser diode of this embodiment further includes an insulating film 11 provided over the substrate 1 so as to cover part of an upper surface of the n-type contact layer 2 and side surfaces of the n-type cladding layer 3, the n-side light guide layer 4, the MQW active layer 5, the p-side light guide layer 6, the intermediate layer 7 and the electron blocking layer 8, side surfaces and part of an upper surface of the p-type cladding layer 9 and side surfaces of the p-type contact layer 10, an n-side electrode 13 formed on the upper surface of the n-type contact layer 2 and a p-side electrode 12 formed on the p-type contact layer 10. The n-side light guide layer 4 and the p-side light guide layer 6 are provided to increase confinement of light into the MQW active layer 5. Note that a p-type impurity is easily diffused and thus the p-side light guide layer 6 is provided also to prevent diffusion of a p-type impurity contained in the p-type cladding layer 9.

In the semiconductor laser diode of this embodiment shown in FIG. 2, the n-type contact layer 2 is formed of n-type GaN having an impurity concentration of $1\times10^{18}$ cm$^{-3}$ so as to have a thickness of 4 µm, the n-type cladding layer 3 is formed of $Al_{0.05}Ga_{0.95}N$ having an impurity concentration of $5\times10^{17}$ cm$^{-3}$ so as to have a thickness of 1.2 µm, and the n-side light guide layer 4 is formed of lamination of an n-type GaN layer having an impurity concentration of $1\times10^{17}$ cm$^{-3}$ and a thickness of about 90 nm and a $Ga_{0.98}In_{0.02}N$ layer having a thickness of about 7.5 nm. In the MQW active layer 5, three distortion quantum well layers each being formed of $Ga_{0.9}In_{0.1}N$ and having a thickness of about 3 nm and two barrier layers each being formed of $Ga_{0.98}In_{0.02}N$ and having a thickness of about 7.5 nm are alternatively stacked one by one. The p-side light guide layer 6 is formed of $Ga_{0.98}In_{0.02}N$ so as to have a thickness of about 80 nm, the intermediate layer 7 is formed of $Al_{0.15}Ga_{0.82}In_{0.03}N$ so as to have a thickness of about 20 nm, the electron blocking layer 8 is formed of p-type $Al_{0.18}Ga_{0.82}N$ having an impurity concentration of about $1\times10^{19}$ cm$^{-3}$ so as to have a thickness of about 10 nm, and the p-type cladding layer 9 is formed of p-type $Al_{0.05}Ga_{0.95}N$ having an impurity concentration of about $1\times10^{19}$ cm$^{-3}$ so as to have a thickness of about 0.5 µm. Moreover, the p-type contact layer 10 is formed of p-type GaN having an impurity concentration of about $1\times10^{20}$ cm$^{-3}$ so as to have a thickness of about 50 nm. In the semiconductor laser diode of this embodiment, when a current flows from the p-side electrode 12 to the n-side electrode 13, blue violet light is generated in the MQW active layer 5 and blue violet laser beam is output from an end face of the MQW active layer 5.

The semiconductor laser diode of this embodiment is characterized in that the intermediate layer 7 is formed of quaternary mixed crystal (AlGaInN) of group III nitride semiconductor. Thus, each of an electron affinity, a difference in lattice constant between the intermediate layer 7 and the electron block layer 8 in a lattice relaxed state and the like can be set to be a proper value to reduce overflow of electrons from the MQW active layer 5. Moreover, a threshold current can be reduced.

Specifically, in the semiconductor laser diode of this embodiment, where a difference between a lattice constant between the intermediate layer 7 in the a-axis direction in a lattice relaxed state and a lattice constant of the electron blocking layer 8 in the a-axis direction in a lattice relaxed state is $\Delta a0$, $\Delta a0$ is 0.4% or less. Thus, piezo polarization occurring in an interface between the intermediate layer 7 and the electron blocking layer 8 can be suppressed to a low level, so that the generation of the fixed charge σ can be reduced and a threshold current of the device can be reduced. Note that $\Delta a0$ is obtained based on {(the lattice constant of the intermediate 7 in a lattice relaxed state)−(the lattice constant of the electron blocking layer 8 in a lattice relaxed state)}×100/(the lattice constant of the electron blocking layer 8 in a lattice relaxed state).

Moreover, in the semiconductor laser diode of this embodiment, a badgap energy (forbidden band width) Eg of the intermediate layer 7 is 3.2 eV or more. Thus, carrier consumption in the intermediate layer 7 is suppressed. Accordingly, a threshold current Ith can be suppressed to a low level.

Moreover, in the semiconductor laser diode of this embodiment, an electron affinity χ of the intermediate layer 7 is 3.35 eV or more and an energy barrier at a conduction band edge between the intermediate layer 7 and the electron blocking layer 8 is 0.25 eV or more. Accordingly, overflow of electrons from the MQW active layer 5 can be suppressed, so that a stable operation with a low threshold current can be achieved.

Reasons for setting composition of the intermediate layer 7 in the above-described manner will be described.

Figure 3:
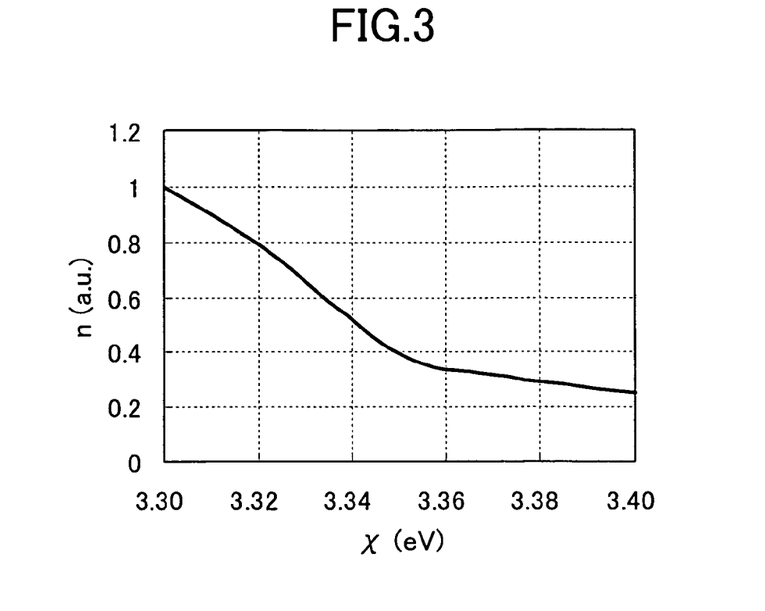
FIG. 3 is graph showing calculation results for the relationship between an electron affinity $\chi$ of an intermediate layer and an electron density n of electrons overflowing in the p-type cladding layer, which have been obtained under the assumption that an electron blocking layer of $Al_{0.18}Ga_{0.82}N$ having the same lattice constant in the a-axis as that of GaN and including distortion is provided in the semiconductor laser diode.

FIG. 3 is graph showing calculation results for the relationship between an electron affinity χ of the intermediate layer and an electron density n of electrons overflowing in the p-type cladding layer, which have been obtained under the assumption that an electron blocking layer of $Al_{0.18}Ga_{0.82}N$ having the same lattice constant in the a-axis direction as that of GaN and including distortion is provided in the semiconductor laser diode.

From the results, it has been found that overflow electrons can be largely reduced by making the electron affinity be equal to or larger than 3.3 eV, which is the electron affinity of GaN. When the intermediate layer is formed of AlGaInN, χ>3.3 eV can be achieved while piezo polarization is suppressed. Therefore, a highly reliable blue violet laser having a low threshold current can be realized. In contrast, when the intermediate layer is formed of group III nitride semiconductor of known ternary mixed crystal, the condition of χ>3.3 eV can not be satisfied while the generation of piezo polarization is suppressed.

Figure 4:
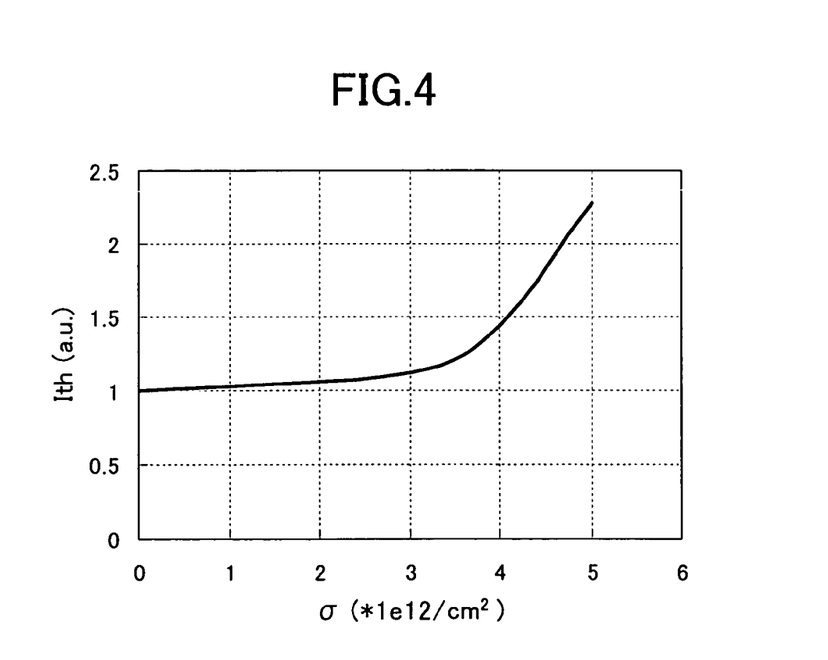
FIG. 4 is a graph showing calculation results for the relationship between a fixed charge σ induced at an interface between an intermediate layer and an electron block layer due to the piezo effect and a threshold current Ith, which have been obtained under the assumption that an electron blocking layer of $Al_{0.18}Ga_{0.82}N$ having the same lattice constant in the a-axis as that of GaN and including distortion is provided in the semiconductor laser diode.

FIG. 4 is a graph showing calculation results for the relationship between the fixed charge σ induced in an interface between the intermediate layer and the electron block layer due to the piezo effect and the threshold current Ith, which have been obtained under the assumption that an electron blocking layer of $Al_{0.18}Ga_{0.82}N$ having the same lattice constant in the a-axis direction as that of GaN and including distortion is provided in the semiconductor laser diode. From the results, it has been found that when σ>$3\times10^{12}$ cm$^{-2}$ holds, Ith is largely increased. In FIG. 12, the relationship between a difference $\Delta a0$ between the lattice constant of the intermediate layer in the a-axis direction and the lattice constant of the electron blocking layer in the a-axis direction and a fixed charge σ is shown. FIG. 12 shows that a condition for setting σ>$3\times10^{12}$ cm$^{-2}$ corresponds $\Delta a0$>0.4%. Therefore, the composition of the intermediate layer is set to be $\Delta a0 \leq 0.4\%$, a low threshold current can be realized.

Figure 5:
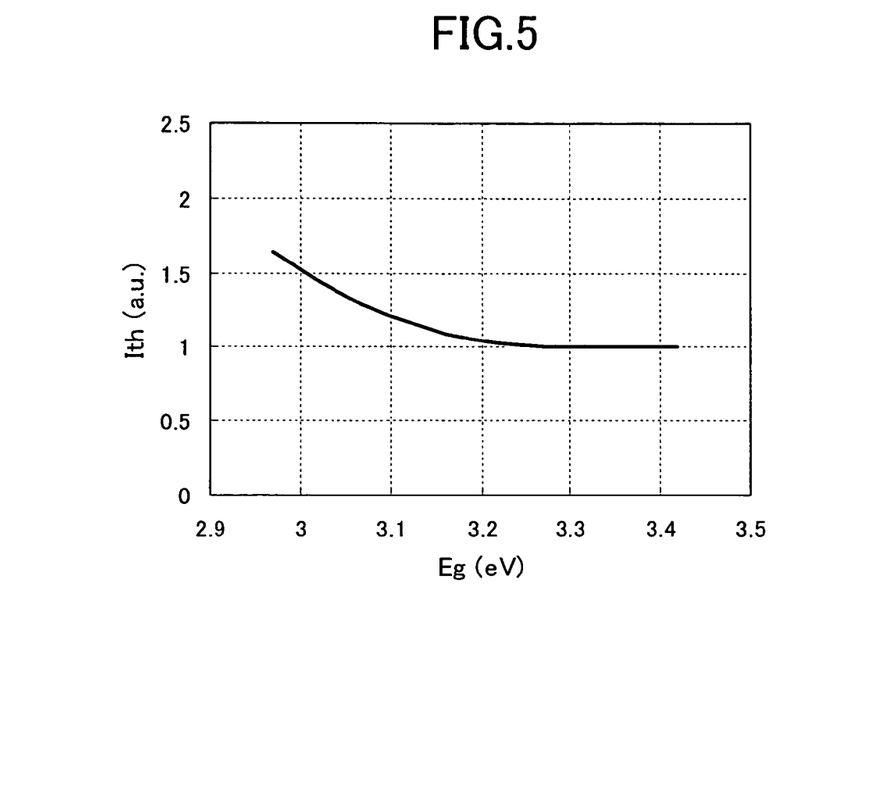
FIG. 5 is a graph showing calculation results for the relationship between a forbidden band width Eg of an intermediate layer and threshold current Ith, which have been obtained under the assumption that an electron blocking layer of $Al_{0.18}Ga_{0.82}N$ having the same lattice constant in the a-axis as that of GaN and including distortion is provided in the semiconductor laser diode.

FIG. 5 is a graph showing calculation results for the relationship between a forbidden band width Eg of the intermediate layer and the threshold current Ith, which have been obtained under the assumption that an electron blocking layer of $Al_{0.18}Ga_{0.82}N$ having the same lattice constant in the a-axis direction as that of GaN and including distortion is provided in the semiconductor laser diode. Form the results, it has been found that Ith is increased with Eg<3.2 eV. The reason for this is considered to be that carriers are consumed in the intermediate layer. Therefore, by setting the forbidden band width Eg of the intermediate layer so that Eg$\geq$3.2 eV holds, a low threshold current can be realized.

Figure 6:
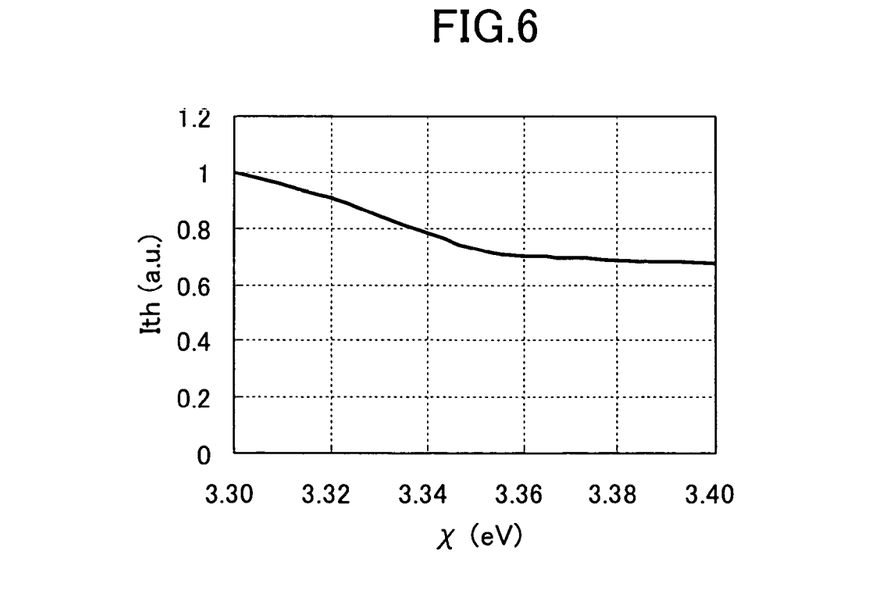
FIG. 6 is a graph showing calculation results for the relationship between an electron affinity $\chi$ of an intermediate layer and a threshold current Ith, which have been obtained under the assumption that an electron blocking layer of $Al_{0.18}Ga_{0.82}N$ having the same lattice constant in the a-axis as that of GaN and including distortion is provided in the semiconductor laser diode.

FIG. 6 is a graph showing calculation results for the relationship between the electron affinity χ of the intermediate layer and the threshold current Ith, which have been obtained under the assumption that an electron blocking layer of $Al_{0.18}Ga_{0.82}N$ having the same lattice constant in the a-axis direction as that of GaN and including distortion is provided in the semiconductor laser diode. From the results, it has been found that as the electron affinity χ is increased from 3.3 eV, Ith is reduced and when the electron affinity χ is 3.35 eV or more, Ith stays substantially at a constant value. Therefore, a low threshold current can be stably realized by setting the electron affinity χ of the intermediate layer so that χ$\geq$3.35 eV holds.

As has been described, in the semiconductor laser diode of this embodiment, the threshold current can be suppressed to a low level and reliability is improved. Therefore, the semiconductor laser diode of this embodiment can be used for various applications such as a blue ray disk light source and the like.

Figure 7:
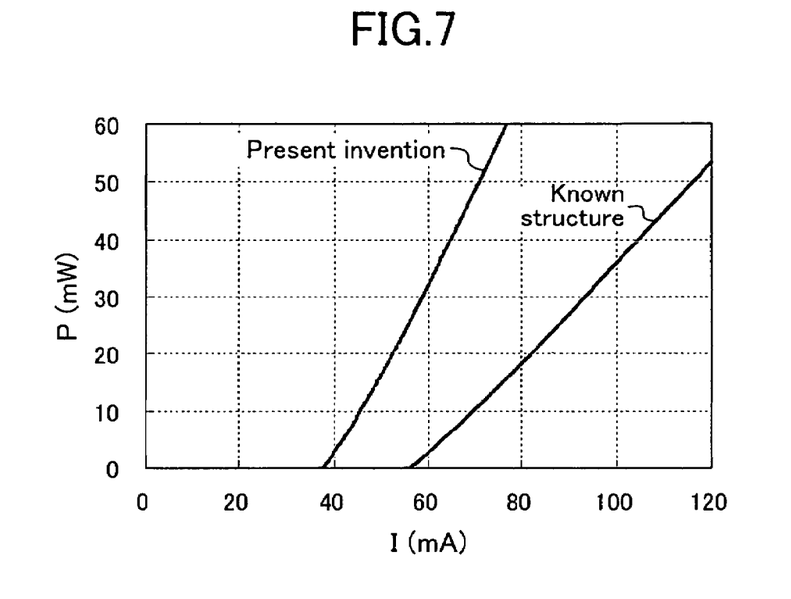
FIG. 7 is a graph showing measurement results for input current-light output (I-L) characteristics in a semiconductor laser diode according to an embodiment of the present invention and a known semiconductor laser diode.

FIG. 7 is a graph showing measurement results for input current-light output (I-L) characteristics in the semiconductor laser diode and the known semiconductor laser diode. As shown in FIG. 7, the threshold current of the semiconductor laser diode of this embodiment is lower than 40 mA at room temperature, i.e., is lower than the threshold current of the known semiconductor laser diode. That is, it is also confirmed that luminous efficiency is largely improved.

Figure 8:
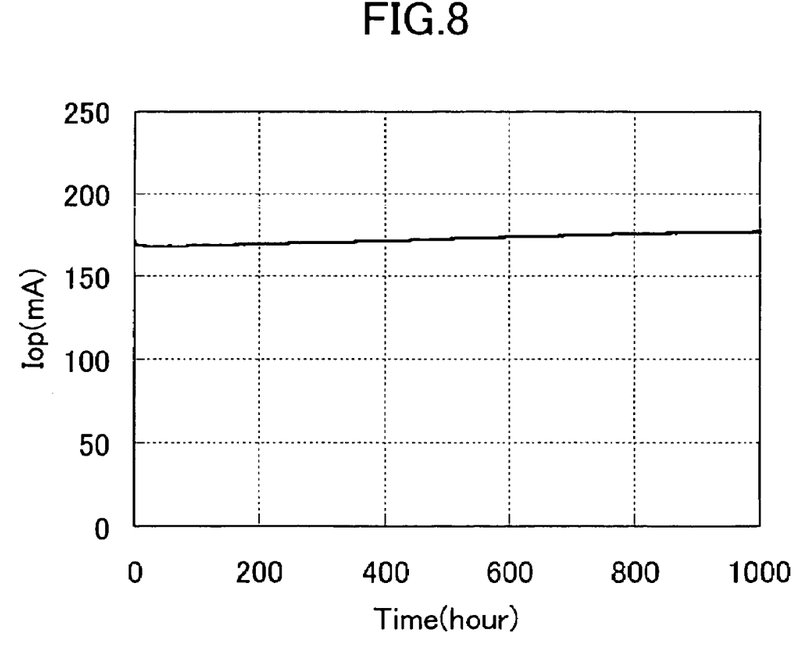
FIG. 8 is a graph showing results of current test for a semiconductor laser diode according to an embodiment of the present invention.

FIG. 8 is a graph showing results of current test for the semiconductor laser diode of this embodiment. In this case, results of APC (automatic power control) test using a pulse current of 100 mW at 60° C. are shown. In this test, when deterioration of the semiconductor laser diode starts, a pulse current Iop is increased. As a result, in the semiconductor laser diode of this embodiment, increase in the pulse current Iop has not been observed at least before a lapse of 1000 hours. This shows that the semiconductor laser diode can be stably operated at a high temperature for long hours.

Note that in the semiconductor laser diode of this embodiment, instead of the sapphire substrate, a semiconductor substrate such as a GaN substrate and the like can be used. In that case, an n-side electrode may provided on a back surface of a substrate. Moreover, the composition ratio of each element in an AlGaInN layer constituting an intermediated layer is not particularly limited to the ratio shown in this embodiment, as long as the composition ratio satisfies the above-described conditions.

In this embodiment, the semiconductor laser diode has been described. However, the structure of the intermediate layer of this embodiment can be applied to a LED including an active layer, an n-type cladding layer and a p-type cladding layer. Thus, a LED capable of being stably operated for long hours with a low power consumption can be realized.

Note that the thickness of the intermediate layer 7 is not limited to the above-described thickness. In the semiconductor laser diode of the present invention, its performance does not depend on the thickness of the intermediate layer 7.

A material of the electron blocking layer 8 is not limited to $Al_{0.18}Ga_{0.82}N$. A material such as $Al_{xb}Ga_{1-xb}N$ ($0 \leq xb \leq 1$) having a smaller electron affinity than that of the intermediate layer 7 can be used.

—Method for Fabricating a Semiconductor Light Emitting Device—

A method for fabricating a semiconductor laser diode according to this embodiment will be described.

FIGS. 9A through 9D are cross-sectional views illustrating respective steps for fabricating the semiconductor laser diode of this embodiment.

Figure 9A:
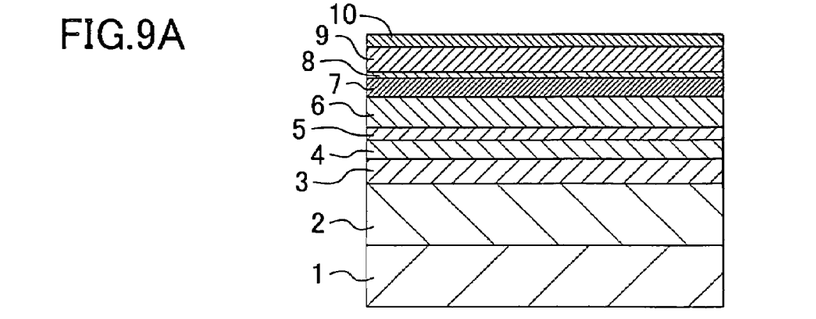
FIGS. 9A through 9D are cross-sectional views illustrating respective steps for fabricating the semiconductor laser diode of this embodiment.

First, as shown in FIG. 9A, a substrate 1 made of sapphire and having a diameter of about 51 mm (2 inches) is prepared and surfaces of the substrate 1 is cleaned with an acid aqueous solution. Subsequently, for example, the cleaned substrate 1 is held on a susceptor provided in a reactor of a metal organic vapor phase epitaxy (MOVPE) apparatus and the reactor is vacuumed. Subsequently, the inside of the reactor is filled with a hydrogen atmosphere at a pressure of about 300× 133.322 Pa (300 Torr) and a temperature of the inside of the reactor is increased to about 1100° C., thereby heating the substrate 1. Thus, thermal cleaning is performed to a substrate surface for about 10 minutes.

Next, after the temperature of the reactor has been reduced to about 500° C., a low temperature buffer layer (not shown) of gallium nitride (GaN) is grown on the substrate 1 to a thickness of about 20 nm by simultaneously supplying trimethylgallium (TMG) at a flow rate of about 25 μmol/min,
ammonia ($NH_3$) gas at a flow rate of about 7.5 L/min and carrier gas of hydrogen. At this time, the ratio between a supply amount of ammonia gas which is a supply source of group V element and a supply amount of TMG which is a supply source of group III element is about 6500.

Subsequently, the temperature of the inside of the reactor is increased to about 1000° C. and silane ($SiH_4$) gas is supplied as an n-type dopant. Thus, an n-type contact layer 2 of n-type GaN is grown on the low temperature buffer layer (not shown) so as to have a thickness of about 4 μm and a silicon (Si) impurity concentration of about $1 \times 10^{18}$ cm$^{-3}$. Next, while trimethylaluminum (TMA) is supplied as a group III material onto the n-type contact layer 2, an n-type cladding layer 3 of n-type $Al_{0.05}Ga_{0.95}N$ having an Si impurity concentration of about $5 \times 10^{17}$ cm$^{-3}$ is grown on the n-type contact layer 2 so as to have a thickness of about 1.2 μm.

Thereafter, an n-side light guide layer 4 is grown so that in the n-side light guide layer 4, n-type GaN having a thickness of about 90 nm and a Si impurity concentration of about $1 \times 10^{17}$ cm$^{-3}$ and $Ga_{0.98}In_{0.02}N$ having a thickness of about 7.5 nm on the n-type cladding layer 3 are stacked in this order. In this process step, $Ga_{0.98}In_{0.02}N$ is grown after the temperature of the inside of the reactor has been reduced to about 800° C. and carrier gas has been changed from hydrogen to nitrogen. When $Ga_{0.98}In_{0.02}N$ is grown, trimethylindium (TMI) and TMG are supplied as group III materials.

Thereafter, a multi-quantum well (MQW) active layer 5 is grown so that in the MQW active layer 5, three distortion quantum well layers each being made of $Ga_{0.9}In_{0.1}N$ having a thickness of about 3 nm and two barrier layers each being made of $Ga_{0.98}In_{0.02}N$ having a thickness of about 7.5 nm on the n-side light guide layer 4 are alternately stacked one by one.

Then, a p-type side light guide layer 6 of $Ga_{0.9}In_{0.02}N$ is grown on the MQW active layer 5 to a thickness of about 80 nm.

Subsequently, an intermediate layer 7 of $Al_{0.15}Ga_{0.82}In_{0.03}N$ is grown on the p-side light guide layer 6 to a thickness of about 20 nm.

Thereafter, while TMA and TMG as supply sources of a group III element, ammonia gas as a supply source of a V group and bis-cyclopentadienylmagnesium (Cp2Mg) gas as a p-type dopant are supplied into the reactor, an electron blocking layer 8 of p-type $Al_{0.18}Ga_{0.82}N$ having a Mg impurity concentration of $1 \times 10^{19}$ cm$^{-3}$ is grown so as to have a thickness of about 10 nm. Subsequently, a p-type cladding layer 9 of p-type $Al_{0.05}Ga_{0.95}N$ having a Mg impurity concentration of about $1 \times 10^{19}$ cm$^{-3}$ is grown on the electron blocking layer 8 so as to have a thickness of about 0.5 μm. The p-type cladding layer 9 may be formed so as to have a super lattice (SL) structure of $Al_{0.10}Ga_{0.90}N/GaN$.

Then, a p-type contact layer 10 of p-type GaN having a Mg impurity concentration of about $1 \times 10^{20}$ cm$^{-3}$ is grown on the p-type cladding layer 9 so as to have a thickness of about 50 nm.

Figure 9B:
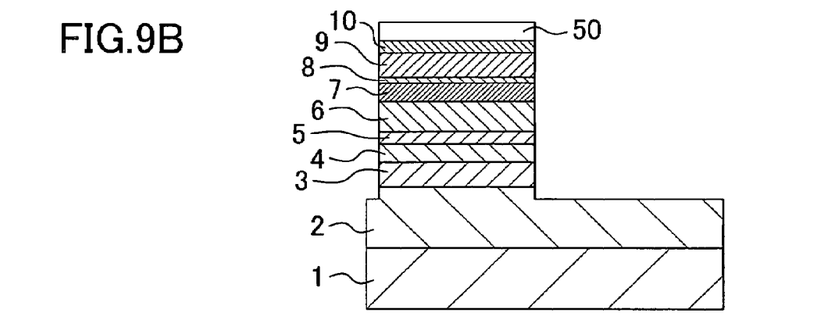

Next, as shown in FIG. 9B, the substrate 1 on which the layers up to the p-type contact layer 10 have been grown is taken out from the reactor, a surface of the p-type contact layer 10 is cleaned with an organic solvent and the surface of the p-type contact layer 10 is further cleaned by wet etching using hydrofluoric acid base chemical solution. Next, for example, using plasma CVD, an insulation film 50 of silicon dioxide ($SiO_2$) is deposited over the p-type contact layer 10 to a thickness of about 0.1 μm. Thereafter, a resist pattern (not shown) is formed on the insulation film 50 by photolithography so as to have a predetermined shape, which corresponds to a shape of a mesa portion and then, using the resist pattern as a mask, a pattern is formed on the insulating film 50, for example, by wet etching using a hydrofluoric acid base aqueous solution. Next, using the insulating film 50 having the predetermined shape as a mask, for example, dry etching using chlorine ($Cl_2$) gas is performed until the n-type contact layer 2 is exposed. By this etching, upper part of the n-type contact layer 2, the n-type cladding layer 3, the n-side light guide layer 4, the MQW active layer 5, the p-side light guide layer 6, the intermediate layer 7, the electron blocking layer 8, the p-type cladding layer 9 and p-type contact layer 10 are patterned so as to form a mesa.

Figure 9C:
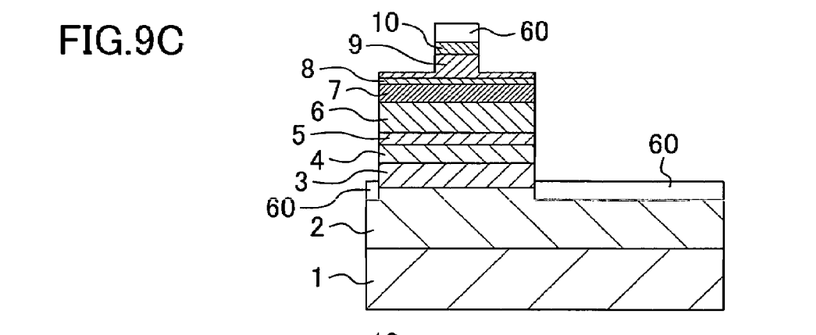

Next, as shown in FIG. 9C, the insulating film 50 used as an etching mask is removed, for example, by wet etching using a hydrofluoric acid base aqueous solution. Thereafter, an insulating film 60 of silicon dioxide ($SiO_2$) is deposited over the substrate again, for example, by plasma CVD so as to have a thickness of about 0.2 μm. Then, a resist pattern (not shown) is formed on the insulating film 60 by photolithography so as to have a predetermined shape, which corresponds to a shape of a ridge portion and then, using the resist pattern as a mask, a pattern is formed on the insulating film 60, for example, by wet etching using a hydrofluoric acid base aqueous solution. Next, using the insulating film 60 having the predetermined shape as a mask, for example, dry etching using chlorine ($Cl_2$) gas is performed to a certain point in the p-type cladding layer 9, thereby forming a ridge. A remaining thickness of the p-type cladding layer 9 is determined according to design for an angle of light radiation or a kink level.

Figure 9D:
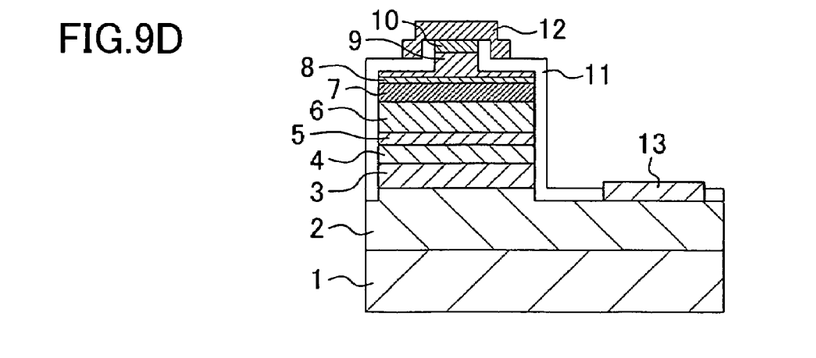

Next, as shown in FIG. 9D, the insulating film used as an etching mask is removed, for example, by wet etching using a hydrofluoric acid base aqueous solution. Thereafter, an insulating film 11 of silicon dioxide ($SiO_2$) is deposited over the substrate again, for example, by plasma CVD so as to have a thickness of about 0.2 μm. Subsequently, a resist pattern (not shown) is formed on part of the insulating film 11 other than an n-side electrode formation region by photolithography so as to have a predetermined shape and then, using the resist pattern as a mask, a pattern is formed on the insulating film 11, for example, by wet etching using a hydrofluoric acid base aqueous solution. Next, with the resist pattern remaining, a titanium (Ti) film and an aluminum (Al) film are formed in this order over the substrate, for example, by vacuum vapor deposition and then the resist pattern is removed with the Ti film and the Al film formed over the resist pattern. Thus, an n-side electrode 13 is formed so as to be in contact with the n-type contact layer 2 through an opening of the insulating film 11. Subsequently, alloying for forming an ohmic contact of the n-side electrode 13 is performed.

Next, in the same manner, part of the insulating film 11 located in the upper part of the ridge is removed and the p-type contact layer 10 is exposed. Then, in the same manner as that for forming the n-side electrode 13, a p-side electrode 12 made of a lamination body including nickel (Ni) and gold (Au) and electrically connected to the p-type contact layer 10 is formed.

Next, although not shown in the drawings, an oscillation structure of a laser element is formed by cleavage and then end face coating is performed onto each end faces of an oscillator obtained by the cleavage. In this case, an oscillator length is, for example, 600 μm, an end face reflection coefficient at a front side is, for example, 10%, and an end face reflection coefficient at a rear side is, for example, 95%.

By the above-described process steps, the semiconductor laser diode of this embodiment including GaN base semiconductor is formed.

The above-described semiconductor light emitting device of the present invention can be used, as a blue ray disk light source, a luminaire light source or the like, for various applications.

What is claimed is:

1. A group III nitride semiconductor light emitting device comprising:
    a substrate;
    an n-type nitride semiconductor layer formed of group III nitride semiconductor containing an n-type impurity on the substrate and including an n-type cladding layer;
    an active layer for generating light, the active layer being formed on the n-type nitride semiconductor layer and having a smaller bandgap energy than that of the n-type cladding layer;
    an intermediate layer formed of undoped $Al_xGa_{1-x-y}In_yN$ (0<x<1, 0<y<1, x+y<1) over the active layer;
    an electron blocking layer formed of p-type group III nitride semiconductor having a smaller electron affinity and a larger Al composition than those of the intermediate layer, and formed directly on the intermediate layer; and
    a p-type nitride semiconductor layer formed of group III nitride semiconductor containing a p-type impurity on the electron blocking layer and including a p-type cladding layer having a larger bandgap energy than that of the active layer,
    wherein the electron blocking layer has a largest Al composition among p-type layers included in the light emitting device, and
    wherein a value obtained by dividing a difference between a lattice constant of the intermediate layer in an a-axis direction in a lattice relaxed state and a lattice constant of the electron blocking layer in the a-axis direction in a lattice relaxed state by the lattice constant of the electron blocking layer in a lattice relaxed state is 0.004 or less.

2. The group III nitride semiconductor light emitting device of claim 1, wherein the electron blocking layer is formed of $Al_{xb}Ga_{1-xb}N(0 \leq xb \leq 1)$.

3. The group III nitride semiconductor light emitting device of claim 1, wherein a bandgap energy Eg of the intermediate layer satisfies $Eg \geq 3.2$ eV.

4. The group III nitride semiconductor light emitting device of claim 1, wherein an electron affinity χ of the intermediate layer satisfies $\chi \geq 3.35$ eV.

5. The group III nitride semiconductor light emitting device of claim 1, wherein the lattice constant of the electron blocking layer in the a-axis direction in a lattice relaxed state is different from a lattice constant of the active layer in the a-axis direction in a lattice relaxed state.

* * * * *